United States Patent [19]
Hicks, Jr.

[11] 4,342,499
[45] Aug. 3, 1982

[54] COMMUNICATIONS TUNING CONSTRUCTION

[76] Inventor: John W. Hicks, Jr., P.O. Box 345, Southbridge, Mass. 01550

[21] Appl. No.: 135,798

[22] Filed: Mar. 31, 1980

Related U.S. Application Data

[63] Continuation-in-part of Ser. No. 21,868, Mar. 19, 1979, Pat. No. 4,315,666.

[51] Int. Cl.³ .............................................. G02B 5/172
[52] U.S. Cl. ............................... 350/96.15; 350/96.29
[58] Field of Search ............... 350/96.15, 96.16, 96.29, 350/96.30, 96.33; 370/1; 455/610, 611, 612

[56] References Cited

U.S. PATENT DOCUMENTS

| | | | |
|---|---|---|---|
| 3,372,969 | 3/1968 | Snitzer | 350/96.33 |
| 3,617,109 | 11/1971 | Tien | 350/96.15 |
| 3,754,988 | 8/1973 | Barnes | 350/96.29 X |
| 3,823,996 | 7/1974 | Kompfner et al. | 350/96.33 |
| 3,871,743 | 3/1975 | Fulenwider | 350/96.29 |
| 4,151,747 | 5/1979 | Gottlieb et al. | 350/96.15 UX |
| 4,237,550 | 12/1980 | Steensma | 350/96.33 X |
| 4,300,816 | 11/1981 | Snitzer et al. | 350/96.33 |

FOREIGN PATENT DOCUMENTS

| | | | |
|---|---|---|---|
| 54-110858 | 8/1979 | Japan | 350/96.15 |
| 1420458 | 1/1976 | United Kingdom | 350/96.15 |

OTHER PUBLICATIONS

Murakami, "Coupling Between Curved Dielectric Waveguides", *Applied Optics*, vol. 19, No. 3, Feb. 1980, pp. 398-403.

Kobayshi et al., "Optical Demultiplexer Using Coupling Between Nonidentical Waveguides," *Applied Optics*, vol. 17, No. 20, Oct. 1978, pp. 3253-8.

*Primary Examiner*—John D. Lee
*Attorney, Agent, or Firm*—Wolder, Gross & Yavner

[57] ABSTRACT

A wave length filter construction using fiber optics techniques and devices for selective tuning. By core coupling for a portion of the fiber lengths, a communications facility is provided and various wave length selection structures are enabled.

39 Claims, 20 Drawing Figures

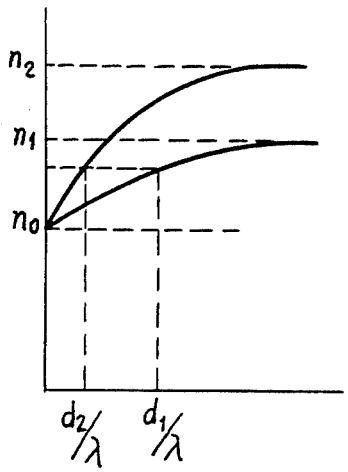
FIG.1
FIG.2
FIG.3
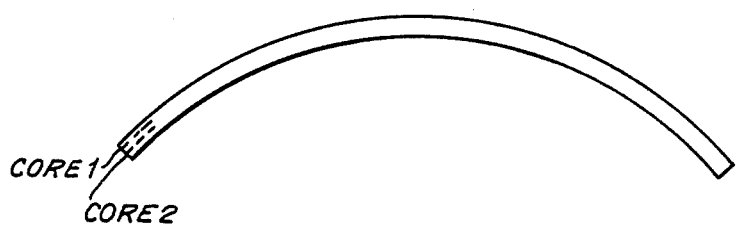
CORE 1
CORE 2
FIG.4
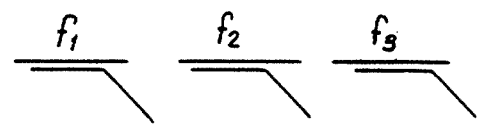
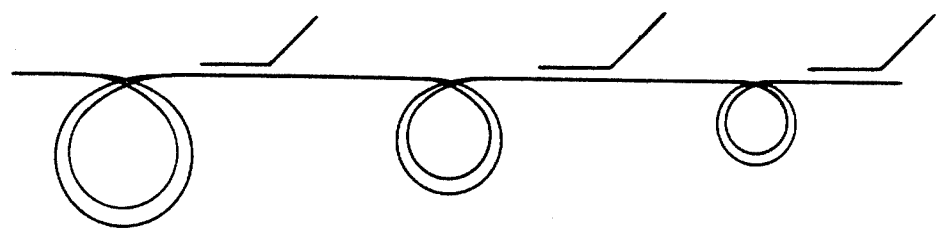
FIG.5

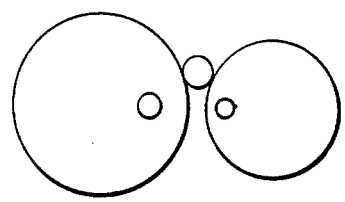
FIG. 6
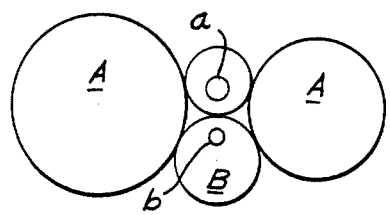
FIG. 7
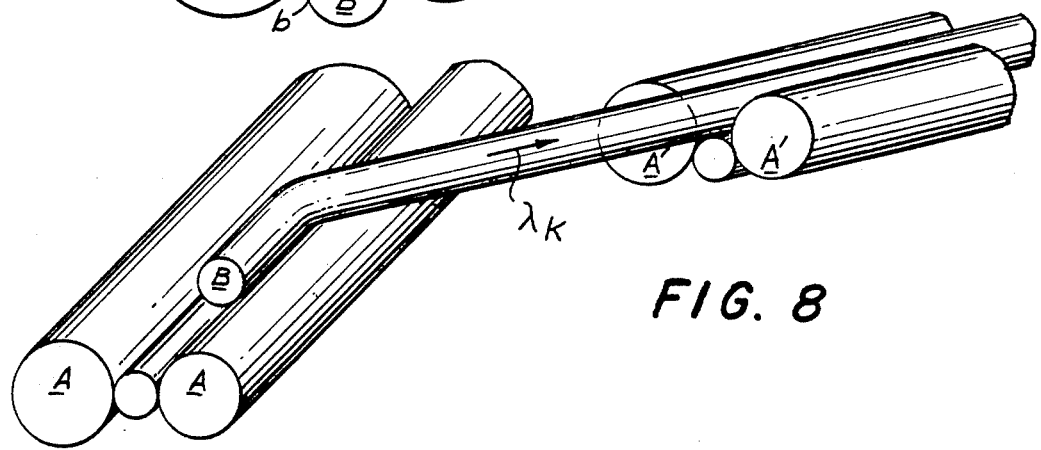
FIG. 8
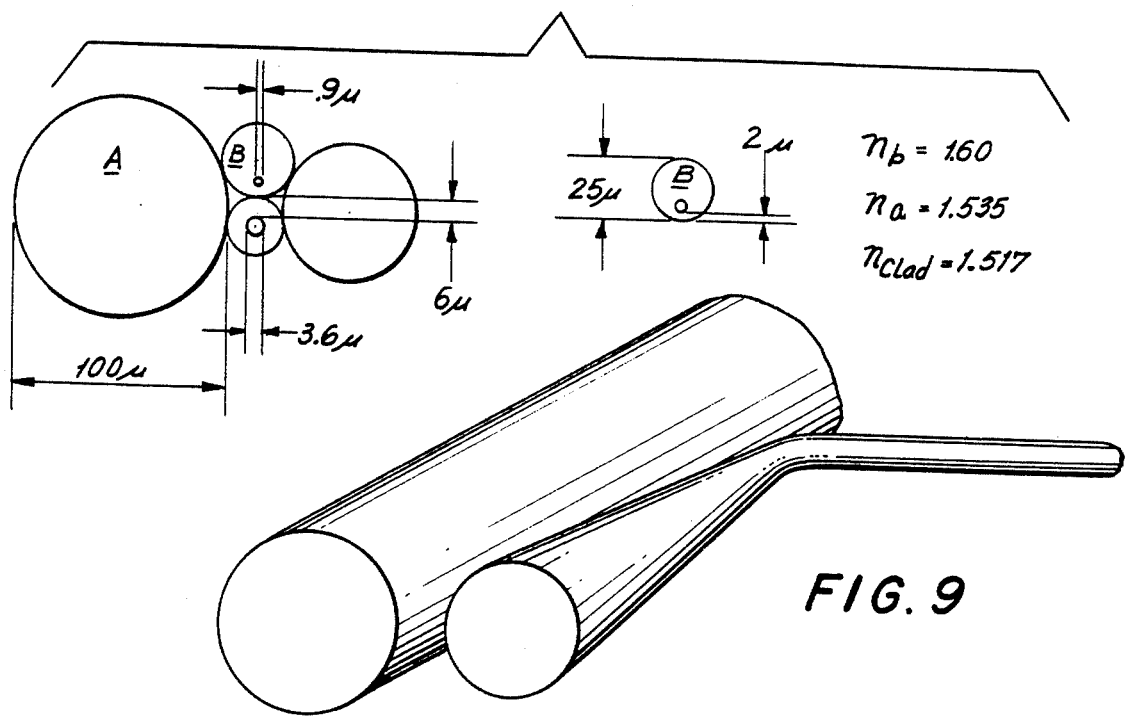
FIG. 8A
FIG. 9

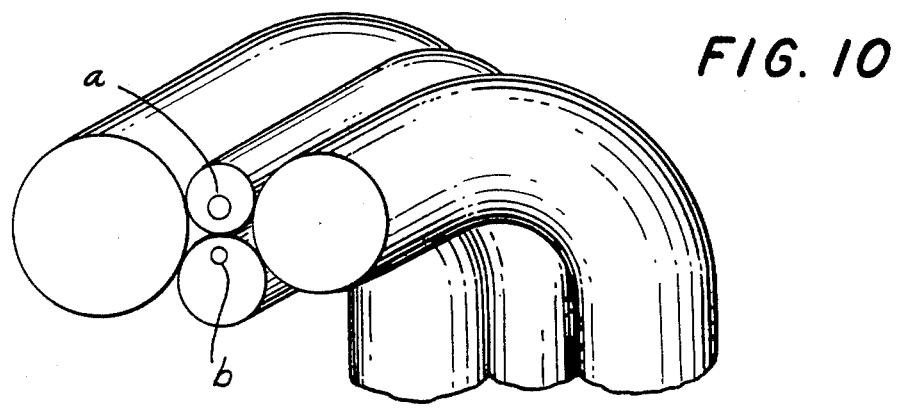
FIG. 10
FIG. 11
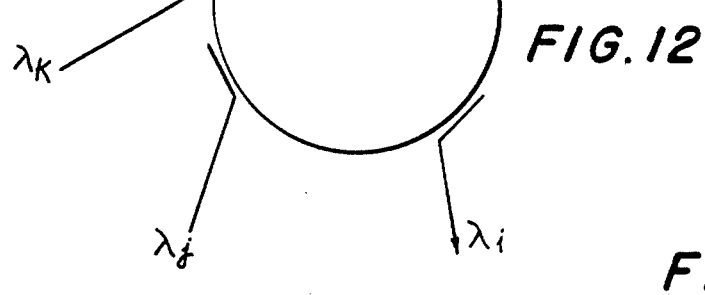
FIG. 12
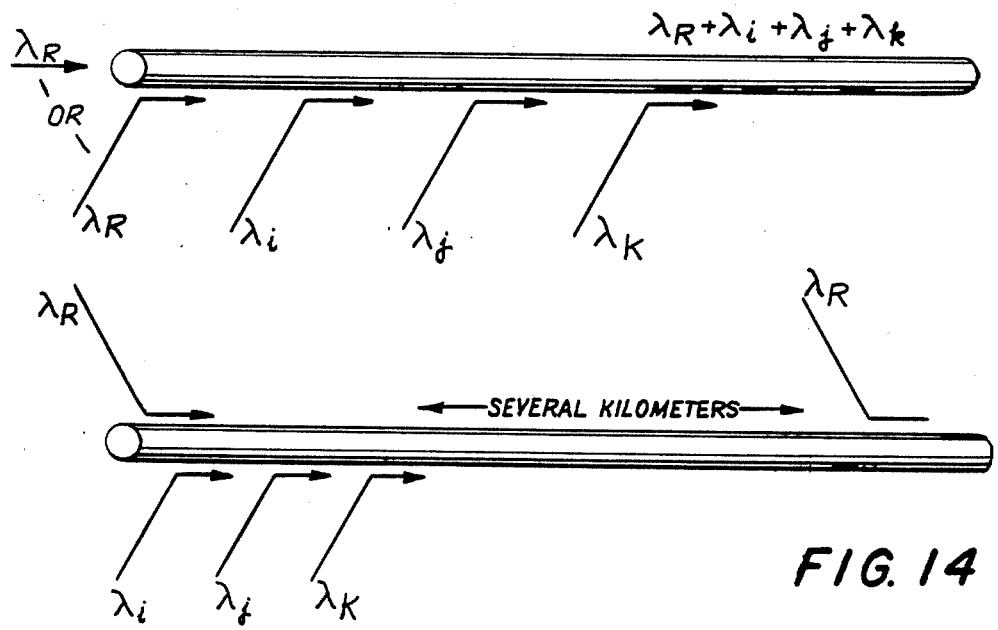
FIG. 13
FIG. 14

COMMUNICATIONS TUNING CONSTRUCTION

This patent application is a continuation-in-part of co-pending U.S. patent application Ser. No. 21,868, filed Mar. 19, 1979, John Wilbur Hicks, Jr., inventor (now U.S. Pat. No. 4,315,666).

This invention relates primarily to communications wave length filter constructions, and more particularly to such constructions which make use of fiber optics devices for allowing selective tuned coupling of the cores thereof.

In the co-pending application, per the above, coupling of fiber optics devices was the subject and communications structures were presented. Briefly, by varying the shape and placement of coupled cores, coupling and decoupling were provided by the invention structure of the co-pending Patent Application.

In addition to the problems solved by the co-pending Patent Application invention, the use of fiber optics devices in communications systems also solves specific problems in terms of coupling fiber optic cores of substantially dissimilar diameter and index of refraction.

Furthermore, it is advantageous in coupling fiber optics devices for communications purposes, to separate wave lengths as close together as ten angstroms.

To accomplish the same result with state of the art filters is expensive. Existing filters are bulky and not easily adaptable to fiber optics propogation format. Much of the propogated light is wasted unless manufacturers design into the system the further complexity of reimaging lenses. For instance, a multi-layer interference coating or a diffraction grating is unsuitable for fiber communications.

Accordingly, a primary object of the present invention is to provide a fiber optics communications structure wherein wave length selective coupling is accomplished.

A further and more particular object of the present invention is to provide fiber optics communications tuning structures for separating wave lengths varying by as little as ten angstroms.

Still further, it is an object of the present invention to provide a fiber optics communications structure with a tuning and detuning capability, which is efficient in the accomplishment of its purpose and inexpensive in its cost.

These and other objects of the present invention are provided in a fiber optics communications structure wherein the fiber optics devices may be selectively tuned and which features at least two fiber optics devices that may be of substantially different diameter and index of refraction. Tuning and detuning is provided by varying the path length by bending the coupled cores to change the wave length at which tuning occurrs or by varying other parameters. A preferred embodiment includes a branch network of fiber optics devices wherein lateral or butt coupling takes place between various branches of the network. Another embodiment features a single main propagation fiber optics core which is twisted into circles of different radii along its length to provide a coupling path length for lateral coupling into selectively placed branches. A still further embodiment provides a gradual taper along its length so that various wave lengths are tuned at various positions along the length of the main fiber. In other words, a first wave length is tuned at a first position and tapped by lateral coupling to a branch, a second wave length is tuned at a second position and tapped by lateral coupling, etc. In this latter embodiment, a combination of bending and tapering is useable to provide greater flexibility.

Other objects, features and advantages will become apparent in the following more detailed description of a preferred, but nonetheless, illustrative embodiment with reference to the accompanying drawings, wherein:

FIG. 1 is a graphical representation illustrating the relationship between propogation constant and diameter for the lowest order mode in order to provide the theoretical basis for the present invention;

FIG. 2 provides a graphical representation illustrating the selective coupling capability of the present invention to show the sharpness of filtering which is provided;

FIG. 3 is a schematic representation of a communications line illustrating tuning by bending;

FIG. 4 is a schematic representation showing a series of individual fibers functioning as filters by coupling into branch fibers;

FIG. 5 is a schematic representation of an alternative structure for the present invention showing selective coupling in a communications network, wherein the main communications fiber is bent into circles of different radii for coupling into branches;

FIG. 6 is a schematic representation illustrating the use of a light-bridging member providing a coupling between two fibers;

FIG. 7 is a schematic representation of a geometry for coupling similar to that of FIG. 6 wherein a pair of fibers provides a positioning jig for another fiber;

FIG. 8 is a schematic representation showing the use of the geometry of FIG. 7 but with a second transfer to a branch line;

FIG. 8A shows the dimensions useful in the geometry of FIG. 8;

FIG. 9 illustrates the use of tapering for tuning the geometry listed by FIGS. 8 and 8A;

FIG. 10 illustrates a second method of tuning by bending the assembly array whose geometry is recommended by FIGS. 8 and 8A;

FIG. 11 is a schematic representation of a third method of tuning, alternative to FIGS. 9 and 10, whereby index of refraction is varied in accordance with an applied pressure;

FIG. 12 is a schematic representation of a delay line comprising a closed loop with injected and/or extracted pulses;

FIG. 13 illustrates a Raman generating beam introduced to a fiber optics communication link according to the present invention; and FIG. 14 shows the invention according to FIG. 13, but with another Raman beam injected onto the line to reamplify the signals at chosen intervals.

In the patent application, Ser. No. 21,868, filed Mar. 19, 1979, inventor: Hicks, lateral resonant coupling was described at length. Similar coupling techniques are useable in the present invention, except herein the cores to be coupled may be dissimilar. For instance, a first core is relatively large with a low index of refraction and another core is of lesser diameter, but with a higher index of refraction.

Presuming only the lowest order mode is propagated by each core at a wave length $\lambda_t$, there is some combination of diameters for the cores which enables equal propagation constants in the two fibers, despite their different indices. The propagation constant of the lowest order $HE_{11}$ mode appears as shown in FIG. 1 (approximately) as a function of diameter. Such a graphical representation enables the selection of a mode matching pair of diameters.

The two cores will, at wave length $\lambda_t$, have the same propagation constant and light at that wave length will be coupled between cores in a length determined by the degree of proximity between the two cores.

If the two cores were identical, all wave lengths would resonate. However, since the two cores are not identical at other values, the propagation constants of the two cores no longer match. If the wave length becomes shorter or longer, the propagation constants no longer match. Thus, there is only one wave length at which exact tuning occurs. In the simplest case, the fibers are in proximity only long enough for $\lambda_t$ to be completely transferred from the first core to the second core. $\lambda_t$ will be completely transferred and other wave lengths only partially transferred. This enables the described device to function as a wave length filter.

Figure 15:
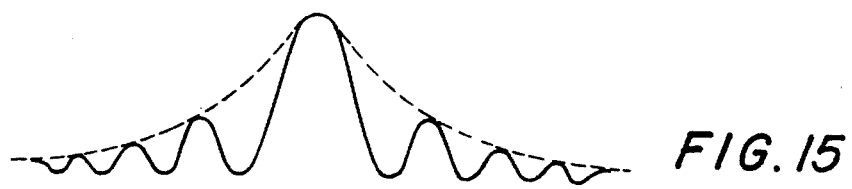
FIG. 15 represents an envelope for the graphical representation of FIG. 2 for the case where two fibers are coupled together over more than one coupling length.

In other cases, the two fibers are coupled together over more than one coupling length. If one draws an envelope over the $\sin^2\theta/\theta^2$ curve as shown in FIG. 15, at any length greater than the coupling length the energy in the second fiber as a function of wave length will be bounded approximately by the envelope.

Figure 16:
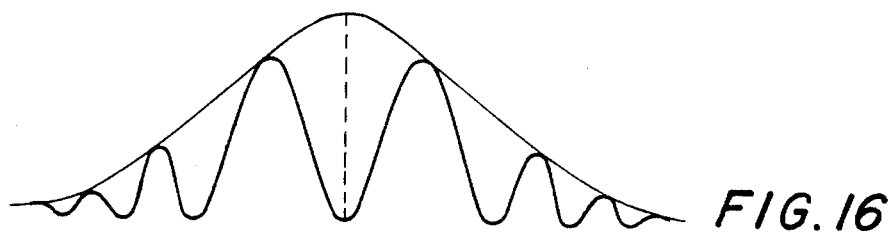
FIG. 16 is a representation of a transfer function for the case where the coupling length is $n+\frac{1}{2}$

If L is $n+\frac{1}{2}$ coupling lengths, the transfer function will be as shown in FIG. 16.

Figure 17:
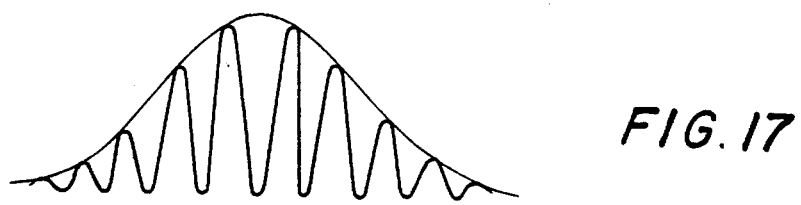
FIG. 17 is a graphical representation of the case where the central maximum becomes sharper as the coupling length is lengthened.

As L becomes longer and L is n coupling lengths, the central maximum becomes sharper, as illustrated in FIG. 17.

The governing equations are similar to the equation for a diffraction grating. In some cases, it may be difficult to control the coupling length exactly, in which case, the fibers are coupled over several coupling lengths. One half the energy will be in the second fiber, averaged over the center of the envelope, even if the length should vary somewhat. By very slight tapering of the two fibers in the coupling region, or by bending over a slightly varying radius of curvature, the fine structure under the envelope can be removed and a relatively smooth curve of one-half the height of the original envelope will result.

As the degree of coupling is decreased and the coupling length increased, the sharpness of the filtering increases. The intensity of light transferred from the first core to the second core is as shown by FIG. 2. The first null occurs approximately when the path difference in the two cores is one-half $\lambda$ in the coupling length $L_c$; that is, when $n_1 \cos\theta_1 L_c - n_2 \times \cos\theta_2 L_c = \frac{1}{2}\lambda$. At $\lambda_t$ the path lengths are the same. This change in path length as a function of $\lambda$ is referred to as dispersion, which can rise from the wave guide properties themselves or dispersion in the basic material. Dispersion from either source leads to a useful filter.

When two entirely independent optical signals are injected into a single core at different frequencies, with such frequencies separated at the distal end, the signal carrying capacity of the core is doubled.

A fiber filter is provided to separate wave lengths as close together as 10 angstroms in the one micron region. More than 100 independent signals are thus transmitted over a single core. Accordingly, a significant decrease in cost of a basic element of a telecommunications system is thus provided.

To alter the wave length at which complete coupling occurs between two cores, bending of the two cores along a circle of some radius is provided, according to the description given in the U.S. patent application, Ser. No. 21,868, filed Mar. 19, 1979, inventor: Hicks. Such a system is represented by FIG. 3, wherein the path length along core one is greater than the path length of core two. The two guides, which have exactly the same propagation constant at $\lambda_t$, when the fiber was straight, will be detuned. Two things happen as a result of the bending, the propagation constant in each core changes because of the stress induced by bending. Even if this were not so, the phases would not stay in step because of the change in path length. Of course, if the fiber is bent in the opposite direction to that shown in FIG. 3, detuning will occur in the opposite direction.

Unlike the parent patent application, dissimilar cores are assumed here, so that instead of either tuning or detuning of all wave lengths, the wave length at which tuning occurs is changed.

As described in the parent patent application, light is either butt-coupled into core one or two separate cores are coupled to core one and core two so that the two paths are thereafter separated. Also, the light filtered into core two is coupled laterally into another physically separate fiber in an alternative embodiment.

A series of individual fibers laterally coupled is thereby provided as represented by FIG. 4.

Still further, a single propagation device (FIG. 5) is bent into a number of circles of different radii, with a tap associated with each circle to accomplish a similar coupling network.

Also, a fiber is gradually tapered to sweep through a series of tuned wave lengths. This is useful in a communications line to deliver signals to a number of homes along a road. As the fiber goes down the road, different wave lengths are tuned in. If a number of houses are spaced exactly 200 feet apart and a series of wave lengths differing by 10 angstroms are to be delivered, this may be accomplished by tuning 10,000 angstroms at a first position, 10,010 at a second position 200 feet away, etc. Tuned lateral coupling over an appropriate length is provided to transfer the tuned wave length. Then non-tuned coupling is provided to tap off into each customer's service line. A combination of bending and tapering is used to provide even greater flexibility in such a network.

According to the present invention, a communications network with selective coupling and tuning is applicable to non-circular cores also.

More specifically, in a fiber optics communications system, it is desirable to be able to send more than one signal over a fiber. Therefore, a means of introducing modulated light at several wavelengths onto one fiber and further means of separating these wavelengths at the far end is advantageous.

Particularly in the terminal distribution networks, as opposed to the trunk lines, it is desirable to use wavelength multiplexing as a means of addressing individual subscribers. Clearly, it would be very expensive to carry a separate fiber from a sub-station to each subscriber. Any means for multiplexing several signals on one fiber and routing the signals to various subscribers must give reasonable security against a signal going to a wrong subscriber. It is therefore, unattractive to carry multiple signals off the main line into a subscriber's building for further addressing. On the other hand, addressing or tapping means at the telephone pole must operate in a rather hostile environment. For these reasons, addressing signals by shared time allocation is unattractive in a terminal distribution network.

It is a purpose of this invention to provide economical and efficient means of wave length multiplexing and demultiplexing. Alternate means are well known. The electromagnetic spectrum may be separated by prisms, diffraction gratings, etalons, and the like. All of these are ill suited to wavelength separation in a fiber optics system because of their size.

Let us take what is perhaps the best suited of the lot, namely a multi-layer filter. Such filters can be designed to reflect one narrow wavelength band and transmit other adjacent wavelengths. Such a filter could be introduced into a fiber optics system with three lenses about the size and complexity (and cost) of a microscope objective, and the lateral positioning of each element in the system would need to be held to a small fraction of the core diameter of the fibers.

The distinguishing feature between a simple lateral coupler and this invention, which is a wave length filter, is a difference in propagation dispersion between the cores to be coupled. The net effect is that at some wavelength $\lambda_k$ the two cores have equal propagation constants and as $\lambda$ departs from $\lambda_k$, the propagation constants become unequal. Thus, a high degree of coupling can be achieved at $\lambda_k$ and substantially less coupling at other wave lengths on each side of $\lambda_k$.

Disperson, that is a variation of propagation constant with wave length, can be caused by the change in index of refraction of the core material with wave length or the change with wave length of the index of the cladding, or both. Dispersion is also a result of the wave guide geometry. Generally, if one considers single mode wave guides, the dispersion will be greater if the index difference between core and cladding is greater. As a very rough approximation—the wave guide dispersion is as follows:

$$\frac{\Delta K}{K} = \frac{-1}{3} \Delta n \frac{\Delta \lambda}{\lambda}$$

Where K is the propagation constant (that is to say the constant in the z dependence of the wave equation):

$$\vec{E} = \vec{f}(x,y) e^{ikz}$$

and where:

$$\Delta n = n_{core} - n_{cladding}.$$

More complex geometries may be used. For instance, a pair of fibers which are relatively tightly coupled can be less tightly coupled to another pair of fibers:

| A 0 | o C |
|---|---|
| B 0 | o D |

It is well known that two coupled single mode fibers of identical propagation constants will exhibit two modes, a so called symmetric mode and an anti-symmetric mode. This splitting of the propagation constant is due to the interaction between the two. Likewise, C and D will have a symmetric and an anti-symmetric mode. Suppose A, B, C and D have identical indices, but C and D are of a slightly different diameter. The symmetric mode of A and B can be made equal to the anti-symmetric mode of C and D. However, the dispersion of the symmetric and anti-symmetric modes will not be equal. Thus, for all other wavelengths the propagation constant will not be matched and the two fibers A and B will transfer energy to C and D at a selected wave length. This has been used to illustrate a sort of "synthetic" dispersion not the result of index dispersion nor of different indices of refraction in different cores.

Moreover, one can use two cores of identical index, but different diameters. In this arrangement, it is, of course, not possible to couple two single mode fibers. But one can couple the $HE_{11}$ mode of the smaller fiber to a higher order mode of the other. This arrangement has severe limitations in practice because several higher order modes are clustered together for a circular core and thus a wave length filter of this type will have several pass bands relatively close together rather than one isolated pass band. This may be somewhat alleviated by coupling a circular single mode fiber to a larger, non-circular (rectangular or elliptical) core. Even in this case, there will be at least two modes close together on the non-circular fiber, but the modes will be differently polarized. Thus, a useful single band filter can be made this way by using a polarizer to reject one of the modes.

It should be pointed out that the very first direct observation of the wave guide nature of fiber optics made by Hicks in 1957 was of this type. He observed that very distinct saturated colors appeared in unilluminated fibers in fiber optics face plates due to cross talk. He correctly identified this as coupling between non-corresponding higher order modes of two cores of slightly different geometry. He also attributed the bright color to a difference in dispersion of the two modes.

All fiber optics face plates exhibit this effect and it is a well known phenomenon. However, the effect is not particularly useful as a wave length filter because of the very complex structure of the transfer bands.

The filters which are the subject of this invention have either one or a very few modes in the wave length region to be used, so that only one transfer band occurs. More properly, other transfer bands are spaced well away from the useful band and outside that portion of the spectrum to be used.

It is obvious that if a lateral coupling filter using two single mode cores is designed for use at one micron wave length, then at one-half micron wave length, there may be many modes and many transfer bands. Generally, these filters will be useful (limited to one band) only over 20% to 30% decrease in wave length.

Filters for this invention have been made using Schott Ba F-4 glass of index $n_d = 1.606$ for one core and Schott ZK-5 glass of index $n_d = 1.534$ for the second core. These tcores have been imbedded in commercial soda lime glass (Corning 0800) of index $n_d=1.510$ With this combination of indices, the following diameters were used:

| Ba F-4 core | $d_1 = .8\lambda$ |
|---|---|
| ZK-5 core | $d_2 = 3.6\lambda$ | where $\lambda$ is the wave length to be transferred. The diameters given are only approximate. Exact diameters can be calculated from the well known boundary value equations for circular dielectric wave guides. However, for cores this small a certain amount of diffusion of chemicals occurs between core and cladding so the idealized geometry is not realized. A certain amount of trial and error is required.

Filters were made using 2 cores in one cladding matrix. This is not too useful for a fiber optics communication system since one would like to take the filtered light signal off onto a branched line. One could accomplish this by a second lateral coupling to a second mechanically separate or separable fiber. This second coupling could be between two identical cores so that non-filtered coupling would take place.

It is difficult to hold two such fibers in close proximity over a coupling length. Therefore, composite fibers have been made from pre-forms, where a fragile bridging member holds the two fibers in fixed relation. This bridging member can be broken so that the fibers can follow different paths.

The bridging member can be differentially etchable to facilitate separating A and B. An advantage of this geometry is that the air gap between A and B effectively decouples them along the bulk of their length. At the branch point, a material of index nearly matching the cladding matrix can be introduced over one coupling length.

A simple geometry involves only one transfer, as shown in FIG. 6. The cores are of different diameters and indices so that a filter couple results.

Another geometry made is shown in FIG. 7. A and B of FIG. 7 are not drawn together, but must be assembled to make a coupler. The geometry of fibers A provides a positioning jig for B. It is only necessary to orient the eccentric core b properly.

The fibers A are suitable for a transmission line. The fiber B has its core b so near the surface that it may have high transmission losses. It can best be used by transferring a second time to a branch line similar to A. (See FIG. 8). At $1\mu$ wavelength, for example, one might use the approximate dimensions shown in FIG. 8A. The coupling length for these dimensions would be about 8 cm. and the pass band would be about 5 Å. In the coupling region it is desirable to have A and B in good contact and to fill the voids with material matching the cladding in index.

The coupling length is very sensitive to spacing and air gaps and the 8 cms recommended is very approximate.

Many geometries have been examined and they have various advantages and disadvantages. The ones shown are intended to illustrate the point.

Consider now the problem of tuning the filter to pass a desired wavelength. If A or preferably B is slightly tapered along its length, tuning may be accomplished by the device of FIG. 9. Moving the coupling material either to a smaller or larger diameter as shown provides the desired result.

A second method of tuning is to bend the assembled array, as shown in FIG. 10. If a and b are tuned at $\lambda = 1\mu$ and are separated by $10\mu$ center to center, and are bent over a radius of 1 cm. for instance, the propagation constant must be shifted by $10\mu/10,000\mu = 1/1,000$ relative to each other to "resonate". With the indices used and using the approximate dispersion equation as follows:

$$\frac{\Delta k}{k} = \tfrac{1}{2}\Delta n\frac{\Delta\lambda}{\lambda} = \tfrac{1}{2}(.0965)\frac{\Delta\lambda}{\lambda}$$

the tuned wavelength would shift about 300 Å. The direction of the shift would depend on the direction of the bend.

A third method of tuning depends on the variation of index of refraction with temperature. If the two cores have different temperature coefficients of index of refraction, a temperature change will change the tuning. For this reason, of course, it is desirable to use matching temperature coefficients where the filter is in an uncontrolled temperature environment.

Still another means of tuning results from the variation of index of refraction with stress. Either of the cores may be stressed separately, or if the stress coefficients are different for the two cores, then they may be stressed equally. For instance, one or both fibers could be stretched. Polarization effects can result in transfer band splitting if the stresses are applied transversely. In any case, one mode can be rejected with a polarizer.

When any of the above tuning devices is used to vary rather than to hold constant the tuned frequency, a switch is provided. That is to say, if a signal at $\lambda_k$ is transmitted along a line, it can be switched onto a branch line by tuning the coupler to $\lambda_k$ or allowed to continue on the main line by detuning from $\lambda_k$.

Therefore, a further application of the invention is to provide a tunable filter for switching.

If the switching can be accomplished rapidly, the device can be used as a modulator or signal generator. Of the tuning means mentioned, the fastest is the application of transverse pressure, as shown in FIG. 11. If a pressure pulse is generated by some piezzo-electric device and mechanically coupled into the side of the fiber by contact, it can generate a very short duration tuning pulse. Since the speed of a compression wave in glass is 3000 to 5000 meters per second, and since the high index core may be as small as 1 micron or even smaller then the tuning pulse will be of duration about $2\times 10^{-10}$ seconds.

Although the pressure dependence of the index of refraction is not great, the filter may be made quite sensitive by increasing the coupling length.

Even temperature modulation will be relatively fast because of the very small transverse dimension of the core and the consequent very rapid cooling rate. Switching times of 1 micro second are possible.

Obviously if a filter coupler is constructed to be used as a switch, it will be sensitive to the variation of some parameter such as tension, curvature, temperature, pressure, or the like. It follows that such a device is useful as a transducer or measuring probe for the parameter to which it is sensitive. For example, if the two cores have substantially different temperature dependence of index of refraction, then a measurement of the exact resonant wavelength will reveal the temperature of the filter coupler. Since wavelength measurements can be made very accurately, such a temperature transducer is very sensitive and quick acting.

Figure 18:
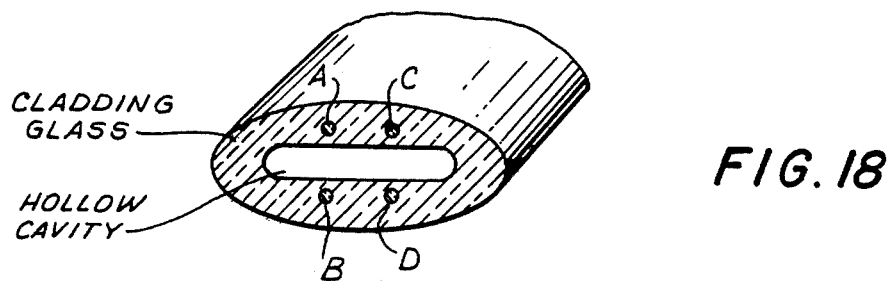
FIG. 18 represents a construction according to the present invention for increasing pressure sensitivity.

Although the pressure sensitivity is not great, a filter coupler is an accurate transducer for higher pressures. The sensitivity can be increased by using a construction as shown in FIG. 18.

The pair A, B has an anti-symmetric mode whose propagation constant crosses the symmetric mode of C, D for some $\lambda$. As the coupling increases, the cross over $\lambda$ changes.

The concept of wavelength multiplexing in a fiber optics communication system is not new, but previously the means did not exist for efficient introduction of many wavelenths onto one fiber and the efficient separation of those wavelengths at the terminal end. Consequently, such systems were limited to 5 or 10 wavelengths at most. With this invention, one might carry up to 200 signals over one fiber. It is, therefore, not only practicable to carry greatly increased bandwidths per fiber in a trunk line, but it is even possible to use wave length multiplexing as the principle means of addressing signals in a terminal distribution or acquisition system.

Figure 19:
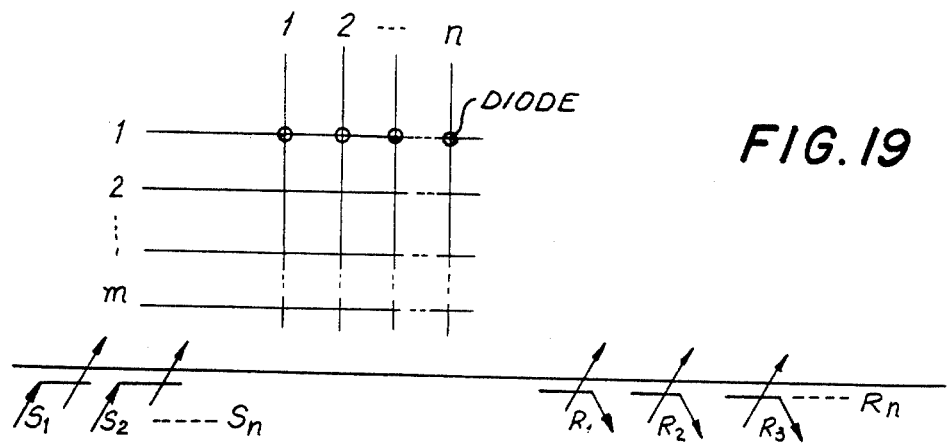
FIG. 19 represents a compact system in the form of an optical switching station according to the present invention.

While the discussion has been implicitly in terms of a telephone-like system, it is not the intention to exclude "compact" systems such as an array of interconnected computers at one location. An optical switching station is an example of a compact system (FIG. 19). In the electronics art, n ports may be switched to m ports by a crossed array of lines with a switching diode at each intersection. There will be n×m diodes. For a large station 10,000 by 10,000 ports would be switchable requiring $10^8$ diodes. The cost would be astronomical, particularly when video frequencies are to be switched.

By placing 10,000 "transmitters" at one end of a fiber and 10,000 receivers at the other end, such a switching station is provided. Let each transmitter have the capacity to select one of one hundred possible wavelengths and modulate that wavelength at 100 times video rate for 5,000 pulses, for example, in one of one hundred possible time slots. Let the desired receiver know by other means what time and wavelength slot have been chosen. The receiver will tune its tunable filter coupler to the assigned $\lambda$ during the assigned time slot and detune its filter to a small adjacent idle wavelength slot between time blocks.

In this system, each sender is, so to speak, "broadcasting" on one of 10,000 channels. All receivers have access to the broadcast energy. The assigned receiver "tunes" to that channel. In this system, there is a great savings of energy since none of the broadcast energy is uselessly extracted by other receivers. There is a high efficiency of delivery from sender to receiver.

Means for generating the signal are known to the optical communications art but the system will be illustrated with a specific means. If there is a Raman beam which generates 100 frequencies by selective optical feedback, let all frequencies be on a common fiber. Let each of the 100 senders have a tunable tap on this "frequency" bus. Sender tunes to $\lambda$ during the assigned time slot to extract a constant beam. This beam will then be modulated with some acousto-optical modulator such as a Pockels cell. This signal is then injected as described onto the switching bus. Although this system is relatively expensive to begin with, the cost does not go up as the product of number of senders times number of receivers. It has, instead a fixed cost, for the Raman generator etc., plus a cost linearly proportioned to the number of senders plus number of receivers.

It is desirable in such a switching system to accumulate a signal at video rate and store it in a buffer memory device and read out this signal at 100 times video rate. At the other receiving end, it is desirable to store this 100 times video rate signal in a memory and extract it at video rate.

The filter couplers which are the subject of this invention, can be used to advantage in constructing such a buffer memory as well as in constructing other information processing and storing devices.

Most particularly, the invention may be used to great advantage in optical delay lines, since one delay line can be multiplexed in wave length to store much more information. Also, the tunable switch is of great advantage in injecting information onto a closed delay line. If a delay line comprising a closed loop, as shown in FIG. 12 is, provided, a series of pulses can be stored for as long as they will circulate before they become too attenuated to detect.

Of course, if the line is closed, it is impossible to inject or extract pulses, except by lateral coupling. The coupling must be tuned for the duration of the injection and detuned before the first pulse has made one trip around so that it won't then extract that pulse. Of course, the $\lambda_j$ $\lambda_k$, etc. switches operate independently since $\lambda_j$ will not extract much of $\lambda_k$ per trip around.

The storage time can be greatly increased by injecting a strong constant $\lambda_r$ of shorter wave length so the device becomes a Raman amplifier. If the signals are at 1 micron for instance, then the Raman generator beam should be at about 0.96 microns. The amplification need only be great enough to compensate for attenuation in the loop.

Amplification by stimulated Raman scattering is known in the art, but this invention provides the means for efficiently introducing the Raman generator beam onto the same fiber with several information signals.

In the same manner, a Raman generating beam may be introduced onto a fiber optics communication link, as shown in FIG. 13.

This allows one to use relatively weak signals and to amplify them after they are on the transmission line. There is, of course, an upper limit to which they can be amplified before they will become the parents of unwanted Raman offspring which will waste their substance.

However, the signals can be re-amplified at intervals after they have become attenuated by injecting another Raman beam onto the line (FIG. 14).

This is much more economical then de-multiplexing, detecting and re-generating the signals for another length of run. The number of times this can be done will depend on several things, among them the inherent noisiness of this kind of amplification. Therefore, it is necessary to re-amplify before the signals are too weak.

The invention may also be used to advantage in selectively filtering off and removing the wave lengths generated by the signals when they in turn generate longer wave length beams by stimulated Raman scattering.

What is claimed is:

1. A wave length selective energy transfer device comprising first and second elongated wave guide structures of different physical characteristics to produce a different dispersion in each said structure, said first wave guide structure supporting at least two wave lengths in only a single energy mode whose phase velocity has a certain wave length dependence and said second wave guide structure supporting an energy mode whose phase velocity has a substantially different wave length dependence, said phase velocity of said single energy mode supported by said first wave guide structure being equal to said phase velocity of said energy mode supported by said second wave guide structure at a certain wave length, but with substantially different dispersions of said two propagated energy modes, and also providing coupling between said wave guide structures for a portion of their lengths.

2. The invention according to claim 1 wherein said dispersion is caused primarily as a result of material index dispersion.

3. The invention according to claim 1 wherein said dispersion is caused primarily as a result of wave guide dispersion.

4. The invention according to claim 1 wherein said dispersion is caused primarily as a result of said modes being dissimilar.

5. The invention according to claim 1 wherein said dispersion is caused primarily as a result of said first wave guide structure having a relatively smaller diameter and a relatively greater index of refraction with respect to said second wave guide structure.

6. The invention according to claim 1 wherein said first wave guide structure is a main transmission line.

7. The invention according to claim 1 wherein the cross-section of said second wave guide structure is other than planar.

8. The invention according to claim 1 wherein one of said wave guide structures is adjustable in propagation constant relative to the other of said wave guide structures.

9. The invention according to claim 1 wherein one of said wave guide structures is a drawn fiber having a core and a cladding.

10. The invention according to claim 1 wherein both of said wave guide structures are drawn fibers each having a core and a cladding.

11. The invention according to claim 10 wherein both of said wave guide structures are drawn from the same preformed material.

12. The invention according to claim 1 wherein both of said wave guide structures are in proximity to each other for most of their lengths and coupled for a part of their lengths to form a filter.

13. The invention according to claim 1 wherein at least one of said wave guide structures is tapered to enable wave length selection at a point along said wave guide structures.

14. The invention according to claim 13 wherein at least one of said wave guide structures is tapered to enable independent selection of more than one wave length at points along said wave guide structures.

15. The invention according to claim 1 wherein said wave guide structures are tunable to a certain wave length by bending of said structures in a plane including both of said structures.

16. The invention according to claim 1 wherein said wave guide structures are tunable by means of temperature variation thereof.

17. The invention according to claim 1 wherein said wave guide structures are tunable by means of stress variation thereof.

18. The invention according to claim 1 wherein said wave guide structures are tunable by means of electric field exposure thereof.

19. The invention according to claim 1 wherein said wave guide structures are tunable by means of magnetic field exposure thereof.

20. The invention according to claim 1 wherein said wave guide structures are tunable by means of a combination of temperature variation, stress variation, electric field exposure and magnetic field exposure thereof.

21. The invention according to claim 1 wherein said wave guide structures are tunable by means of temperature variation of only a portion of said device.

22. The invention according to claim 1 wherein said wave guide structures are tunable by means of stress variation of only a portion of said device.

23. The invention according to claim 1 wherein said wave guide structures are tunable by means of electric field exposure of only a portion of said device.

24. The invention according to claim 1 wherein said wave guide structures are tunable by means of magnetic field exposure of only a portion of said device.

25. The invention according to claim 1 wherein said wave guide structures are tunable by means of a combination of temperature variation, stress variation, electric field exposure and magnetic field exposure of only a portion of said device.

26. The invention according to claim 1 wherein said wave guide structures are tunable by means of altering the relative position of only a portion of said device.

27. The invention according to claim 1 wherein said wave guide structures are tunable by means of altering the relative absorption of only a portion of said device.

28. The invention according to claim 1 wherein said device is a switch comprising a tunable filter.

29. The invention according to claim 1 wherein said device is a modulator comprising a rapidly tunable filter.

30. The invention according to claim 1 wherein said device is a transducer comprising a tunable filter.

31. The invention according to claim 1 wherein said device is a communication device.

32. The invention according to claim 31 wherein said device performs multiplexing operations.

33. The invention according to claim 31 wherein said device performs addressing operations.

34. The invention according to claim 1 wherein said device is a computer.

35. The invention according to claim 34 wherein said device performs memory operations.

36. The invention according to claim 1 wherein said device is a closed loop optical transmission line.

37. The invention according to claim 1 wherein said device is an information handling device.

38. The invention according to claim 1 wherein said device is a transducer.

39. The invention according to claim 1 wherein said device is a switching station.

* * * * *